(12) United States Patent
Scheiper et al.

(10) Patent No.: US 8,349,695 B2
(45) Date of Patent: Jan. 8, 2013

(54) WORK FUNCTION ADJUSTMENT IN HIGH-K GATE STACKS INCLUDING GATE DIELECTRICS OF DIFFERENT THICKNESS

(75) Inventors: Thilo Scheiper, Dresden (DE); Andy Wei, Dresden (DE); Martin Trentzsch, Dresden (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 122 days.

(21) Appl. No.: 12/848,741

(22) Filed: Aug. 2, 2010

(65) Prior Publication Data

US 2011/0049642 A1 Mar. 3, 2011

(30) Foreign Application Priority Data

Aug. 31, 2009 (DE) .................... 10 2009 039 418

(51) Int. Cl.
*H01L 23/336* (2006.01)
(52) U.S. Cl. ........ 438/287; 438/199; 438/216; 438/288; 257/324; 257/E21.192
(58) Field of Classification Search .............. 257/314, 257/324, 325, 369, 405, 406, 410, E21.192; 438/199, 216, 287, 288
See application file for complete search history.

(56) References Cited

U.S. PATENT DOCUMENTS

| 6,703,277 | B1 | 3/2004 | Paton et al. | 438/287 |
| 7,807,990 | B2 * | 10/2010 | Koyama et al. | 257/24 |
| 7,964,489 | B2 * | 6/2011 | Koyama et al. | 438/591 |
| 2007/0178637 | A1 | 8/2007 | Jung et al. | 438/216 |
| 2008/0017936 | A1 | 1/2008 | Buchanan et al. | 257/411 |
| 2008/0128822 | A1 | 6/2008 | Koyama et al. | 257/369 |
| 2008/0308865 | A1 | 12/2008 | Wang et al. | 257/345 |
| 2009/0014809 | A1 | 1/2009 | Sekine et al. | 257/369 |
| 2009/0039437 | A1 | 2/2009 | Ogawa | 257/369 |
| 2009/0098693 | A1 | 4/2009 | Nakajima | 438/199 |

FOREIGN PATENT DOCUMENTS

| EP | 1 531 496 A2 | 5/2005 |
| EP | 2 053 653 A1 | 4/2009 |
| JP | 2009194352 | 8/2009 |

OTHER PUBLICATIONS

Translation of Official Communication from German Patent Office for German Patent Application No. 10 2009 039 418.4 dated Jun. 15, 2010.
PCT Search Report and Written Opinion from PCT/US2010/046572 dated Nov. 22, 2010.

* cited by examiner

*Primary Examiner* — Eduardo A Rodela
(74) *Attorney, Agent, or Firm* — Williams, Morgan & Amerson

(57) ABSTRACT

In sophisticated manufacturing techniques, the work function and thus the threshold voltage of transistor elements may be adjusted in an early manufacturing stage by providing a work function adjusting species within the high-k dielectric material with substantially the same spatial distribution in the gate dielectric materials of different thickness. After the incorporation of the work function adjusting species, the final thickness of the gate dielectric materials may be adjusted by selectively forming an additional dielectric layer so that the further patterning of the gate electrode structures may be accomplished with a high degree of compatibility to conventional manufacturing techniques. Consequently, extremely complicated processes for re-adjusting the threshold voltages of transistors having a different thickness gate dielectric material may be avoided.

19 Claims, 10 Drawing Sheets

FIG. 2k

WORK FUNCTION ADJUSTMENT IN HIGH-K GATE STACKS INCLUDING GATE DIELECTRICS OF DIFFERENT THICKNESS

BACKGROUND OF THE INVENTION

1. Field of the Invention

Generally, the present disclosure relates to the fabrication of highly sophisticated integrated circuits including advanced transistor elements that comprise gate electrode structures including a high-k gate dielectric.

2. Description of the Related Art

Advanced integrated circuits, such as CPUs, storage devices, ASICs (application specific integrated circuits) and the like, include a large number of circuit elements on a given chip area according to a specified circuit layout. In a wide variety of integrated circuits, field effect transistors represent one important type of circuit element that substantially determines performance of the integrated circuits. Generally, a plurality of process technologies are practiced for forming field effect transistors, wherein, for many types of complex circuitry, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the scaling of the channel length, and associated therewith the reduction of channel resistivity, which in turn causes an increase of gate resistivity due to the reduced dimensions, has been a dominant design criterion for accomplishing an increase in the operating speed of the integrated circuits.

Presently, the vast majority of integrated circuits are based on silicon due to its substantially unlimited availability, the well-understood characteristics of silicon and related materials and processes and the experience gathered during the last 50 years. Therefore, silicon will likely remain the material of choice for future circuit generations designed for mass products. One reason for the dominant role of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, during anneal cycles to activate dopants and to cure crystal damage without sacrificing the electrical characteristics of the interface.

For the reasons pointed out above, in field effect transistors, silicon dioxide has been preferably used as a base material of a gate insulation layer that separates the gate electrode, frequently comprised of polysilicon or other materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density to provide the desired drive current for a given supply voltage, a certain degree of capacitive coupling, provided by the capacitor formed by the gate electrode, the channel region and the silicon dioxide disposed therebetween, has to be maintained. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 80 nm may require a gate dielectric made of silicon dioxide as thin as approximately 1.2 nm. Although, usage of high speed transistor elements having an extremely thin gate dielectric may be restricted to high speed signal paths, whereas transistor elements with a thicker gate dielectric may be used for less critical circuit portions, such as storage transistor elements and the like, the relatively high leakage current caused by direct tunneling of charge carriers through an ultra-thin silicon dioxide gate insulation layer may reach values for an oxide thickness in the range of 1-2 nm that may not be compatible with requirements for many types of circuits, even if only transistors in speed critical paths are formed on the basis of an extremely thin gate oxide.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

As is well known, the work function of the gate dielectric material may significantly affect the finally obtained threshold voltage of field effect transistors, which is presently accomplished by appropriately doping the polysilicon material, which may be used in combination with a silicon oxide-based material in conventional gate electrode structures. Upon introducing a high-k dielectric material, the adjustment of an appropriate work function may require the incorporation of appropriate metal species into the gate dielectric material, for instance in the form of lanthanum, aluminum and the like, in order to obtain appropriate work functions and thus threshold voltages for P-channel transistors and N-channel transistors. Moreover, the sensitive high-k dielectric material may have to be protected during the processing, while a contact with well-established materials, such as silicon and the like, may also be considered disadvantageous since the Fermi level may be significantly affected upon contacting a high-k dielectric material, such as hafnium oxide, with a polysilicon material. Consequently, a metal-containing cap material may typically be provided on the high-k dielectric material when provided in an early manufacturing stage. Additionally, the metal-containing material may provide superior conductivity and may also avoid any depletion zone, which may be observed in polysilicon gate electrode structures. Consequently, a plurality of additional process steps and material systems are introduced in well-established CMOS process techniques in order to form gate electrode structures including a high-k dielectric material in combination with a metal-containing electrode material. In other approaches, replacement gate approaches may be applied in which essentially gate electrode structures may be provided as placeholder material systems, wherein, after finishing the basic transistor configurations, the gate electrode structures may be replaced by at least an appropriate metal-containing electrode material, possibly in combination with a high-k dielectric material, thereby requiring complex process sequences for removing the initial gate material, such as polysilicon, and forming appropriate metal species, wherein appropriate work function values also have to be adjusted by incorporating corresponding work function adjusting species, as discussed above.

In addition to enhancing performance of gate electrode structures by incorporating a high-k dielectric material in sophisticated semiconductor devices, frequently, transistor elements of different characteristics, for instance of different leakage behavior, have to be provided, thereby requiring a gate dielectric material of different material composition and/or of different thickness. In some conventional approaches, the high-k dielectric material in combination with any work function adjusting species are provided in an early manufacturing stage, wherein a different thickness of the gate dielectric material may also be provided in different device regions in order to provide different transistor types, or any other circuit elements, such as polysilicon resistors and the like. It turns out, however, that the conventional process strategy for providing gate electrode structures with differently composed gate dielectrics may result in significant threshold voltage variations, as will be described in more detail with reference to FIGS. 1a-1g.

FIG. 1a schematically illustrates a cross-sectional view of a semiconductor device 100 which comprises a substrate 101 and a semiconductor layer 102 formed above the substrate 101. The semiconductor layer 102 is typically provided in the form of a silicon material, as explained above. Moreover, a first semiconductor region or active region 102A and a second semiconductor region or active region 102B are provided in the semiconductor layer 102. The active regions 102A, 102B are to be understood as semiconductor regions in and above which transistor elements are to be formed on the basis of gate electrode structures including a high-k dielectric material. In the example shown, it may be assumed that a gate electrode structure of reduced gate dielectric thickness is to be formed on the semiconductor region 102A, while a gate electrode structure having a gate dielectric material of increased thickness is to be formed on the semiconductor region 102B. Furthermore, in the manufacturing stage shown, a gate dielectric material 151 is selectively formed on the active region 102B and is comprised of silicon dioxide with a specific thickness, for instance with a thickness of several nanometers, depending on the device requirements or any transistors to be formed in and above the semiconductor region 102B.

The semiconductor device 100 as illustrated in FIG. 1a may be formed on the basis of well-established process techniques including processes for forming an isolation structure (not shown) in order to laterally define the lateral size and position of the active regions 102A, 102B. Moreover, a basic dopant concentration may be established in the regions 102A, 102B corresponding to the conductivity type of the transistors to be formed in the respective active region. As previously explained, since a significant threshold voltage variability may exist between transistor elements of reduced thickness of the gate dielectric material relative to transistors with an increased thickness, in some cases, a corresponding countermeasure may be applied by appropriately providing a well dopant profile in the active region 102B in order to obtain the desired threshold voltage. For example, a certain degree of counter-doping may be introduced into the active region 102B, which, on the other hand, may reduce the overall charge carrier mobility in a channel region of a corresponding transistor still to be formed. Next, the dielectric layer 151 may be formed, for instance, by well-established deposition techniques, in order to obtain a silicon oxide-based material having the desired thickness and material composition. Thereafter, an etch mask 103, such as a resist mask and the like, may be provided on the basis of lithography techniques so as to expose a portion of the layer 151 above the active region 102A, while covering the material 151 above the active region 102B. Thereafter, an appropriate etch process 104 may be performed, for instance, on the basis of wet chemical etch recipes, plasma assisted etch recipes and the like, in order to remove the exposed portion of the layer 151 selectively to the underlying silicon material in the region 102A.

FIG. 1b schematically illustrates the semiconductor device 100 in a further advanced manufacturing phase in which the etch mask 103 is removed and the device 100 is exposed to a cleaning ambient 105 in order to remove contaminants and also to re-grow a thin dielectric base layer 152 on the semiconductor region 102A. For this purpose, a plurality of well-established process techniques are available in order to obtain a silicon dioxide material on the basis of a well-controllable growth process.

FIG. 1c schematically illustrates the semiconductor device 100 when exposed to a deposition ambient 106 in which a high-k dielectric material, such as hafnium oxide, is deposited above the active regions 102A, 102B, thereby forming a high-k dielectric layer 153. Thus, the layers 152 and 153 in combination may represent the gate dielectric material of a transistor to be formed in and above the semiconductor region 102A, thereby providing the required characteristics for high performance transistors, while the layer 153 in combination with the "thick" silicon dioxide material 151 represents the dielectric material for transistors and other circuit elements in which a superior performance with respect to reduced leakage currents and the like is required. It should be appreciated that the deposition process 106 may be performed on the basis of any appropriate deposition recipe, for instance, by chemical vapor deposition (CVD), physical vapor deposition (PVD) and the like. For example, a thickness of the high-k dielectric layer 153 may be in the range of one to several nanometers, depending on the overall requirements in view of capacitive coupling, leakage currents and the like.

FIG. 1d schematically illustrates the device 100 in a further advanced manufacturing stage. As shown, a titanium nitride material 107 is formed on the high-k dielectric material 153, thereby providing reliable enclosure of the sensitive material 153 during the further processing of the device 100. Titanium nitride has proven to be a viable material in combination with sophisticated high-k metal gate electrode structures in view of confining sensitive high-k materials acting as an etch stop material, providing superior conductivity, for instance, compared to doped polysilicon material, and the like. Typically, the titanium nitride layer 107 may be deposited by any appropriate deposition technique with a thickness of approximately one nanometer to several nanometers. Moreover, a further material layer, such as a metal layer 154, with a thickness of several Angstrom, may be formed on the titanium nitride layer 107 and may be comprised of an appropriate metal species in order to adjust the work function and thus the threshold of transistor elements to be formed in the active regions 102A, 102B. As previously explained, the layer 154 may be provided with different material characteristics for transistors of different conductivity type, such as P-channel transistors and N-channel transistors, in order to adjust an appropriate work function for each transistor type. For convenience, the material 154 in the active regions 102A, 102B may be provided for one type of transistor, such as an N-channel transistor or a P-channel transistor, and may thus include any appropriate species, such as lanthanum for an N-channel transistor or aluminum for a P-channel transistor, and the like. In other device regions in which the material 154 may be inappropriate for adjusting the desired threshold voltage, any portions of these materials may be selectively removed by any appropriate lithography and etch technique and subsequently a further material may be deposited, possibly in combination with an additional titanium nitride layer, if required.

Next, the semiconductor device 100 may be annealed at temperatures of approximately 700-900° C. in order to initiate the diffusion of the species in the layer 154 through the titanium nitride material 107 into the high-k dielectric material 153 so as to finally form the work function adjusting species at an interface 153S formed between the materials 152 and 153 above the semiconductor region 102A and formed by the materials 151 and 153 above the semiconductor region 102B. If required, the process 108 may include any further anneal step for stabilizing the metal species at the interface 153S, which may include the incorporation of a further species, such as nitrogen and the like, if considered appropriate. Thereafter, any residue of the layer 154 is removed and the titanium nitride material 107 may also be removed in order to provide superior conditions during the subsequent processing of the device 100, for instance in terms of patterning a gate layer stack, since the previously treated titanium nitride material 107 may otherwise result in pattern-related irregularities during the complex gate patterning process.

FIG. 1e schematically illustrates the semiconductor device 100 with the exposed high-k dielectric material 153, which may now comprise fixed charges 153A, 153B in the form of the previously diffused metal species in order to obtain a desired work function for the transistors to be formed in and above the active regions 102A, 102B in the subsequent processing. As previously explained, upon forming transistor elements on the basis of the layer systems 152 and 153 above the region 102A and the layers 151 and 153 above the region 102B, a significant difference in threshold voltage may be observed, wherein the reason for this variability is not yet understood. Without intending to restrict the present application to the following explanation, it is believed that the different position of the fixed charges 153A compared to the fixed charges 153B with respect to the silicon material may strongly affect the resulting threshold voltage, which may require significant modifications in order to re-adjust the difference in threshold voltage.

FIG. 1f schematically illustrates the semiconductor device 100 with a further titanium nitride layer 155 formed on the high-k dielectric layer 153 in order to confine the material 153 and stabilize the work function adjusting species contained therein. For this purpose, any appropriate deposition technique may be applied, as previously discussed. Based on the material system shown in FIG. 1f, the further processing may be continued by depositing a silicon material, possibly in combination with additional cap materials and the like, as may be required for the further processing of the device 100. For instance, any hard mask materials, for instance in the form of amorphous carbon and the like, in addition to cap materials in the form of silicon nitride and the like, may be deposited based on well-established process techniques. Thereafter, the resulting material stack is patterned by applying sophisticated lithography techniques for forming an appropriate hard mask followed by anisotropic etch techniques for etching through the silicon material, through the titanium nitride material 155, the high-k material 153 and the dielectric materials 152 and 151, respectively.

FIG. 1g schematically illustrates the semiconductor device 100 in a further advanced manufacturing stage. As illustrated, a gate electrode structure 150A is formed above the active region 102A and comprises the layers 152, 153 and 155 in combination with a polysilicon material 156. Moreover, a sidewall spacer structure 157 is formed on sidewalls of the materials 152, 153, 155 and 156. Similarly, a gate electrode structure 150B is formed on the active region 102B and comprises the polysilicon material 156 and the layers 155 and 153, wherein the silicon dioxide material 151 may provide the increased thickness of the combined gate dielectric material. Furthermore, drain and source regions 161 are formed in the active regions 102A, 102B. The drain and source regions 161 may be formed on the basis of well-established process techniques, such as ion implantation and the like, wherein the spacer structure 157 may be used as an implantation mask during some of the required implantation steps. As previously indicated, the transistors 160A, 160B may have a different threshold voltage for a given configuration of the drain and source regions 161 and the channel region 162, which may require additional process steps for re-adjusting the threshold voltage of at least one of the transistors 160A, 160B. For instance, as previously explained, a counter-doping may be introduced into the active region 102B which, however, may result in a deteriorated charge carrier mobility in the channel region 162. In other cases, at least for P-channel transistors, a band gap offset obtained by providing a silicon/germanium alloy on the basic silicon material may be re-adjusted, for instance, by increasing the thickness of a corresponding channel semiconductor alloy and/or by increasing a germanium concentration, possibly in combination with a modified well doping in the active region 102A, which may introduce additional defects during the epitaxial growth of a corresponding semiconductor material.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which a work function adjusting species may be incorporated into a sophisticated gate dielectric material at an early manufacturing stage for gate electrode structures and other circuit elements, wherein the work function adjusting species may be positioned above a semiconductor material in substantially the same manner in gate electrode structures having a gate dielectric of reduced thickness and gate electrode structures having a gate dielectric of increased thickness. Without intending to restrict the present disclosure to the following explanation, it is believed that a superior degree of uniformity in positioning a work function adjusting species in gate dielectric materials of different thicknesses at substantially the same offset from the underlying semiconductor region may significantly contribute to a more uniform threshold voltage of the resulting transistor elements. To this end, an appropriate process sequence and material system may be provided in which the incorporation of the work function species may be accomplished on the basis of substantially the same conditions for any type of gate electrode structure prior to incorporating an additional dielectric material for those gate electrode structures that require a gate dielectric material of increased thickness. Consequently, other complex mechanisms, such as the counter-doping of specific well regions, the increase of material thickness and/or germanium concentration of an additional silicon/germanium alloy and the like, may be avoided or the corresponding mechanisms may be significantly reduced in their effects, which may thus result in superior transistor uniformity and in a reduced degree of complexity of the resulting process sequence.

One illustrative method disclosed herein relates to forming a semiconductor device. The method comprises forming a material layer stack above a first device region and a second device region, wherein the material layer stack comprises a dielectric base layer, a high-k dielectric material formed on the dielectric base layer and a metal-containing material formed on the high-k dielectric material. The method further comprises performing a heat treatment so as to diffuse a metal species from the metal-containing material to an interface that is formed by the dielectric base layer and the high-k dielectric material. Moreover, the method comprises forming a dielectric layer selectively above the second device region after performing the heat treatment. Additionally, the method comprises forming a first gate electrode structure above the first device region and a second gate electrode structure above the second device region, wherein the first gate electrode structure comprises the dielectric base layer and the high-k dielectric material as a first gate dielectric and wherein the second gate electrode structure comprises the dielectric base layer, the high-k dielectric material and the dielectric layer as a second gate dielectric.

A further illustrative method disclosed herein comprises forming a dielectric base layer on a first semiconductor region and a second semiconductor region of a semiconductor device. Additionally, the method comprises forming a high-k dielectric material on the dielectric base layer above the first and second semiconductor regions, wherein the dielectric base layer and the high-k dielectric material form an interface. Moreover, a work function adjusting species is formed at the interface above the first and second device regions. Furthermore, a dielectric material is formed on the high-k dielectric material selectively above the second semiconductor region. Finally, the method comprises forming a first gate electrode structure on the first semiconductor region and forming a second gate electrode structure on the second semiconductor region.

One illustrative semiconductor device disclosed herein comprises a first gate electrode structure formed on a first semiconductor region and comprising a first dielectric base layer, a first high-k dielectric material formed on the first dielectric base layer and a metal-containing electrode material that is formed on the first high-k dielectric material. The semiconductor device further comprises a second gate electrode structure formed on a second semiconductor region and comprising a second dielectric base layer, a second high-k dielectric material formed on the second dielectric base layer and a dielectric layer formed on the second high-k dielectric material.

BRIEF DESCRIPTION OF THE DRAWINGS

The disclosure may be understood by reference to the following description taken in conjunction with the accompanying drawings, in which like reference numerals identify like elements, and in which.

Figure 1A:
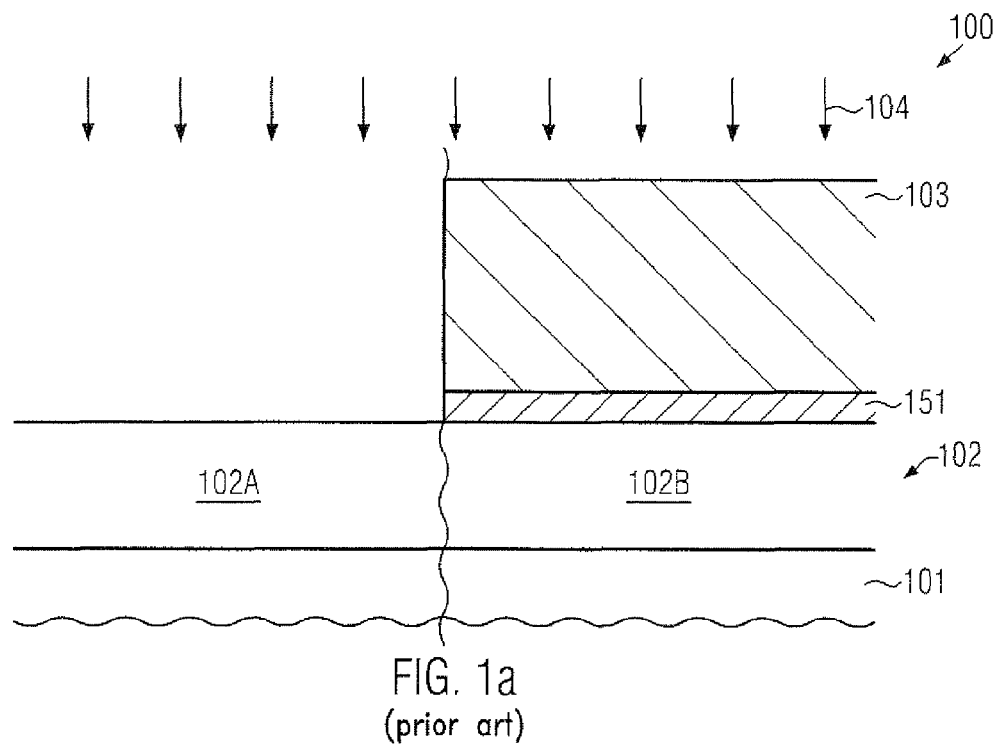
FIGS. 1a-1g schematically illustrate cross-sectional views of a semiconductor device during various manufacturing stages in forming complex transistor elements including gate electrode structures having a gate dielectric layer with a high-k dielectric material and with a different thickness, according to conventional strategies.
Figure 1B:
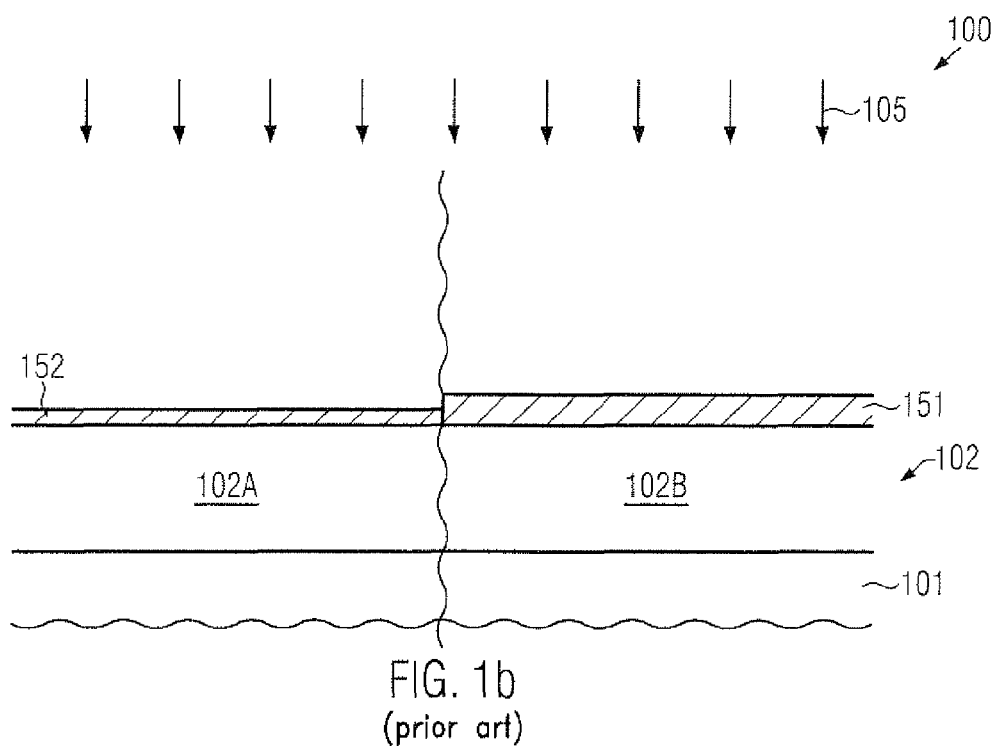
Figure 1C:
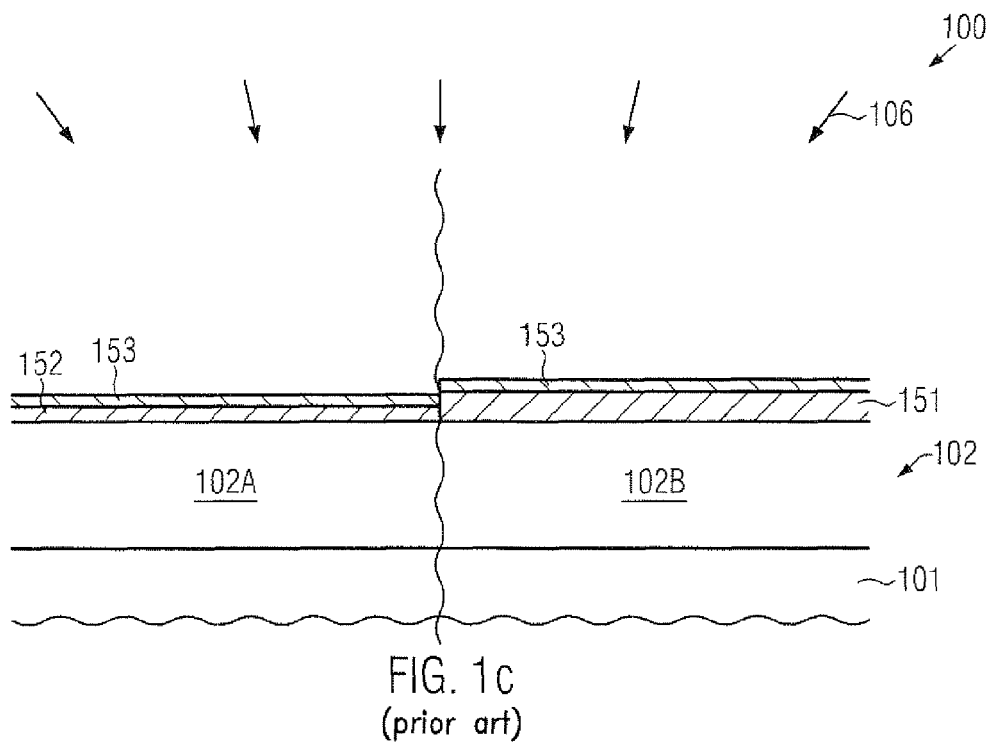
Figure 1D:
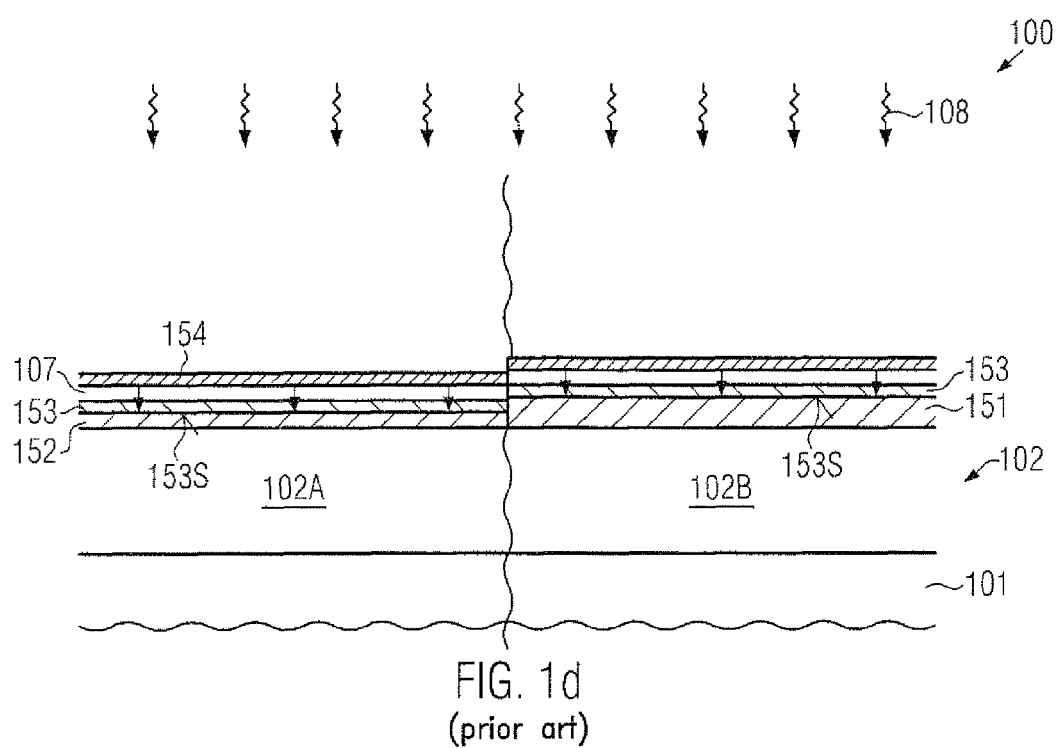
Figure 1E:
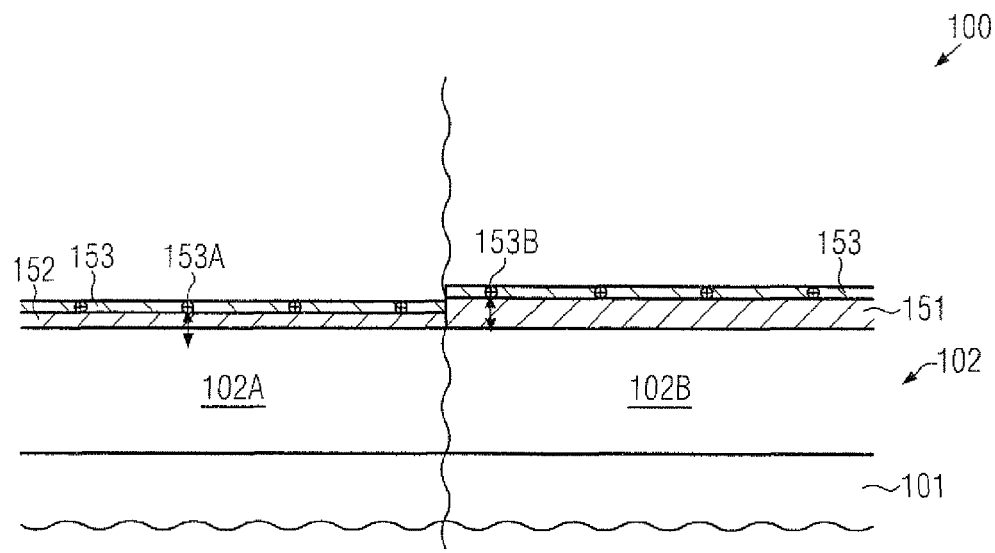
Figure 1F:
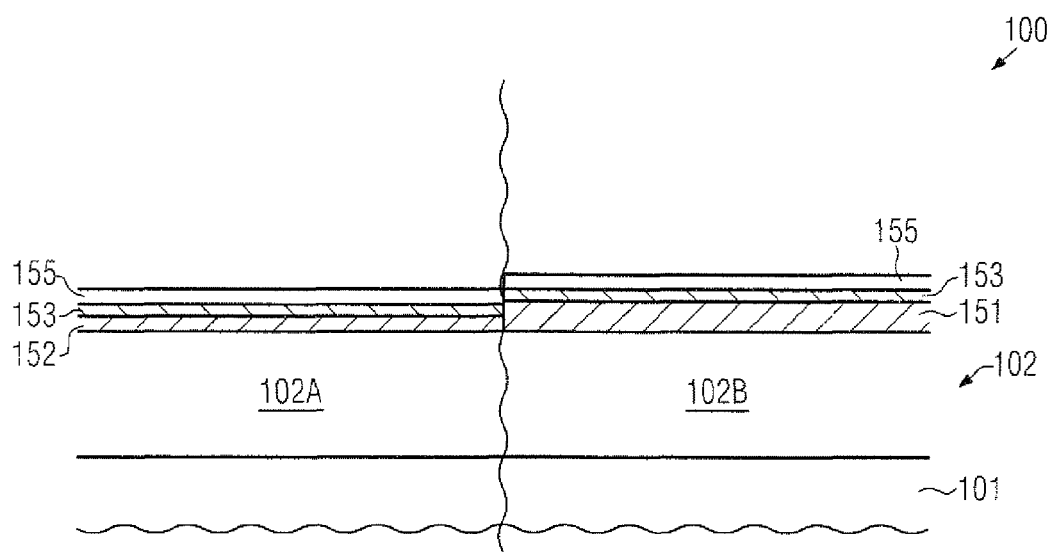
Figure 1G:
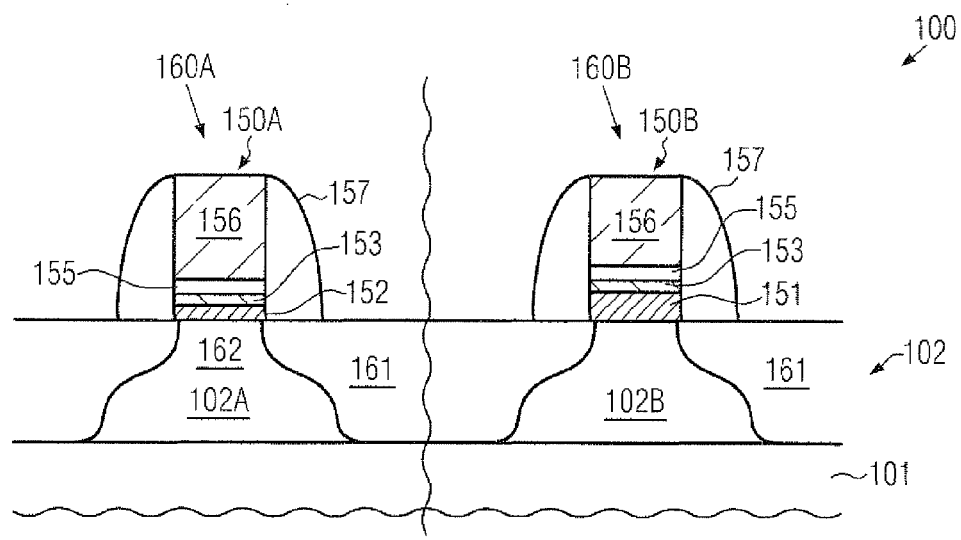

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides semiconductor devices and manufacturing techniques in which a work function adjusting species may be incorporated into the gate dielectric material of gate electrode structures in an early manufacturing stage, i.e., prior to actually patterning the gate electrode structures, wherein a high degree of uniformity may also be achieved with respect to the position of the work function adjusting species above the underlying semiconductor material. To this end, the work function adjusting species may be diffused and stabilized in a manufacturing stage in which the gate electrode structures of transistors of the same conductivity type which may require different thickness gate dielectric materials may have the same configuration, thereby avoiding any non-uniformities in the vertical distance, as is the case in conventional process strategies, as previously described with reference to FIGS. 1a-1g. After the positioning of the work function adjusting species, the further characteristics of the gate dielectric materials may be adjusted, for instance in terms of the finally desired thickness, thereby reducing any effect on the finally obtained threshold voltage of these transistor elements. In some illustrative embodiments, the process sequence may be applied in such a manner that "gate electrode structures" having a thick gate dielectric material may be used as non-transistor elements, such as resistors in the form of polysilicon resistors and the like, since a metal-containing electrode material may not be provided in these circuit elements, thereby not unduly reducing the overall resistivity of the actual electrode material, such as a polysilicon material and the like. On the other hand, the gate electrode structures having the "thin" gate dielectric material may provide the desired high performance characteristics since the high-k dielectric material may be provided in combination with a metal-containing electrode material, while nevertheless the different gate electrode structures may provide a very uniform threshold voltage behavior of the corresponding transistor elements.

With reference to FIGS. 2a-2m, further illustrative embodiments will now be described in more detail, wherein reference may also be made to FIGS. 1a-1g, when appropriate.

Figure 2A:
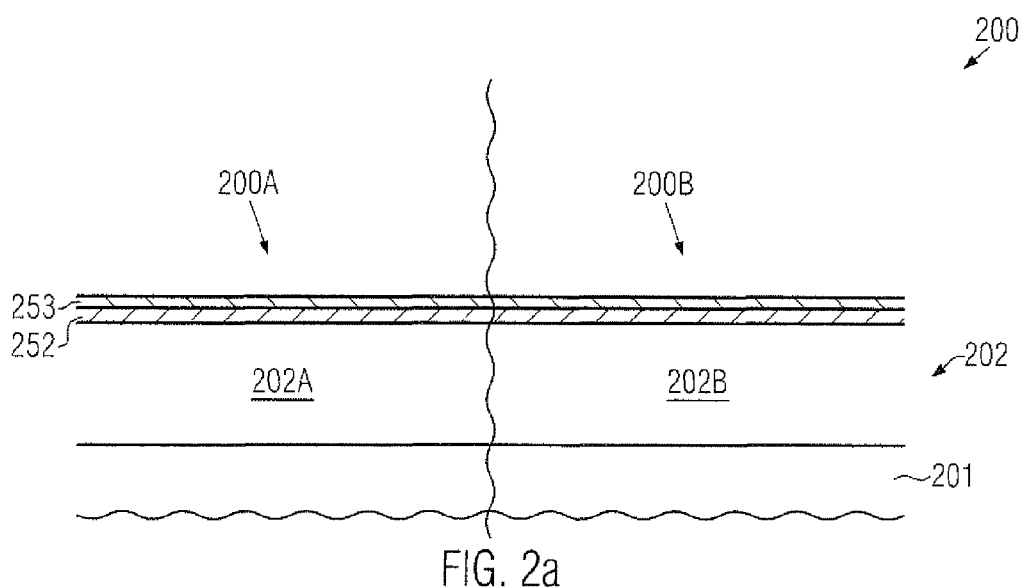
FIGS. 2a-2h schematically illustrate cross-sectional views of a semiconductor device during various manufacturing stages when forming transistors having gate electrode structures with a high-k dielectric material and with different thickness gate dielectrics by positioning a work function adjusting species substantially at the same height level above an underlying semiconductor material, according to illustrative embodiments.

FIG. 2a schematically illustrates a cross-sectional view of a semiconductor device 200 comprising a substrate 201 and a semiconductor layer 202, such as a silicon-based layer and the like, wherein, if appropriate, a buried insulating layer (not shown) may be formed between the substrate 201 and the semiconductor layer 202, at least in some device regions, such as regions 200A, 200B. That is, the device 200 may comprise device regions having a bulk configuration, a silicon-on-insulator (SOI) configuration or both configurations may be used in different device regions. Corresponding semiconductor regions or active regions 202A, 202B may be provided in the device regions 200A, 200B, respectively, which may be laterally delineated by appropriate isolation structures, as will be described later on in more detail. Moreover, in the manufacturing stage shown, a dielectric base layer 252, such as a silicon oxide-based material or any other appropriate dielectric material, such as silicon oxynitride and the like, may be formed on the active regions 202A, 202B, followed by a high-k dielectric material 253. With respect to a thickness and material composition of the high-k dielectric material 253, the same criteria may apply as previously explained with reference to the semiconductor device 100. The dielectric base layer 252 may be formed by oxidation and/or deposition, possibly in combination with other surface treatments and the like, depending on the desired material composition. Similarly, the high-k dielectric material 253, which, in one illustrative embodiment, may be provided in the form of hafnium oxide, may be deposited on the basis of any appropriate deposition technique.

Figure 2B:
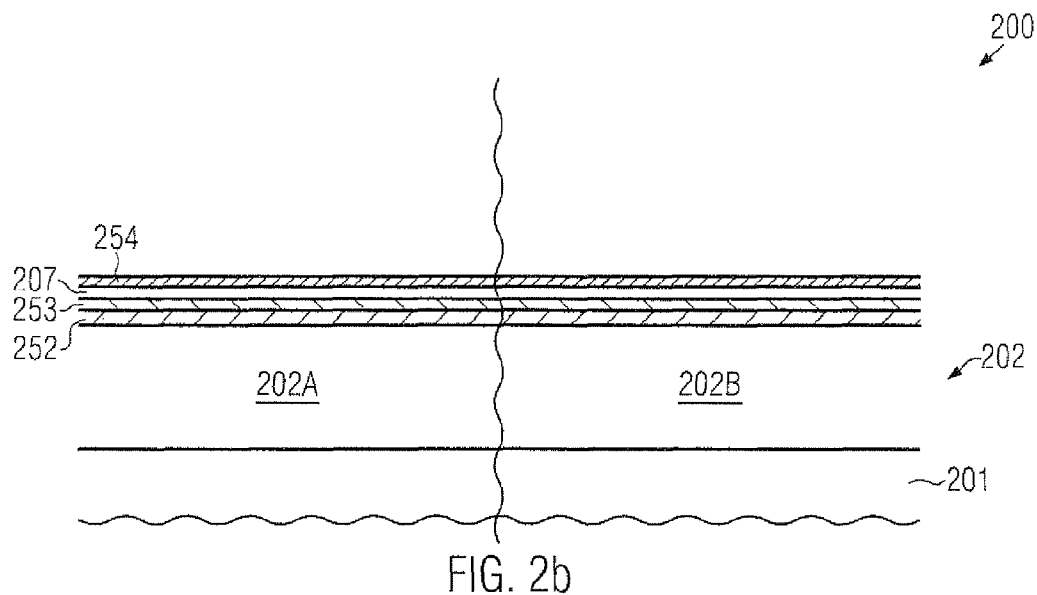

FIG. 2b schematically illustrates the semiconductor device 200 with a metal-containing cap layer 207 formed on the high-k dielectric material 253, followed by a further metal-containing material 254, wherein, in other illustrative embodiments, the materials 207, 254 may be provided in the form of a single material layer, if considered appropriate. For instance, the layer 207 may be provided in the form of a titanium nitride material with a thickness of several Angstrom to several nanometers or even thicker, while the material layer 254 may be provided with a thickness of several Angstrom to several nanometers, depending on the desired concentration of a work function adjusting species to be formed within the gate dielectric material comprised of the materials 252 and 253. It should be appreciated that FIG. 2b illustrates the material layer stack as may be required for adjusting the work function of a specific transistor type, such as a P-channel transistor or an N-channel transistor, wherein, in other cases, additional material layers may be provided, for instance a further titanium nitride material in combination with an additional work function adjusting species may be provided above the material system as shown in FIG. 2b in order to obtain the desired work function adjustment in other device areas, in which the material system of FIG. 2b may have been removed. In this case, a material system as shown in FIG. 2b may be provided in device areas with an appropriately adapted material layer 254. For convenience, any such configurations for forming material systems for adjusting the work function of transistors of different conductivity type are not shown in FIG. 2b. Consequently, the layer 207 or the layer 254 may comprise an appropriate species, such as lanthanum for N-channel transistors, aluminum and the like, which is to be incorporated in the gate dielectric material comprised of the layers 252 and 253. With respect to any deposition techniques for forming the layers 207 and 254, it may be referred to the semiconductor device 100, as previously described with reference to FIGS. 1a-1f.

Figure 2C:
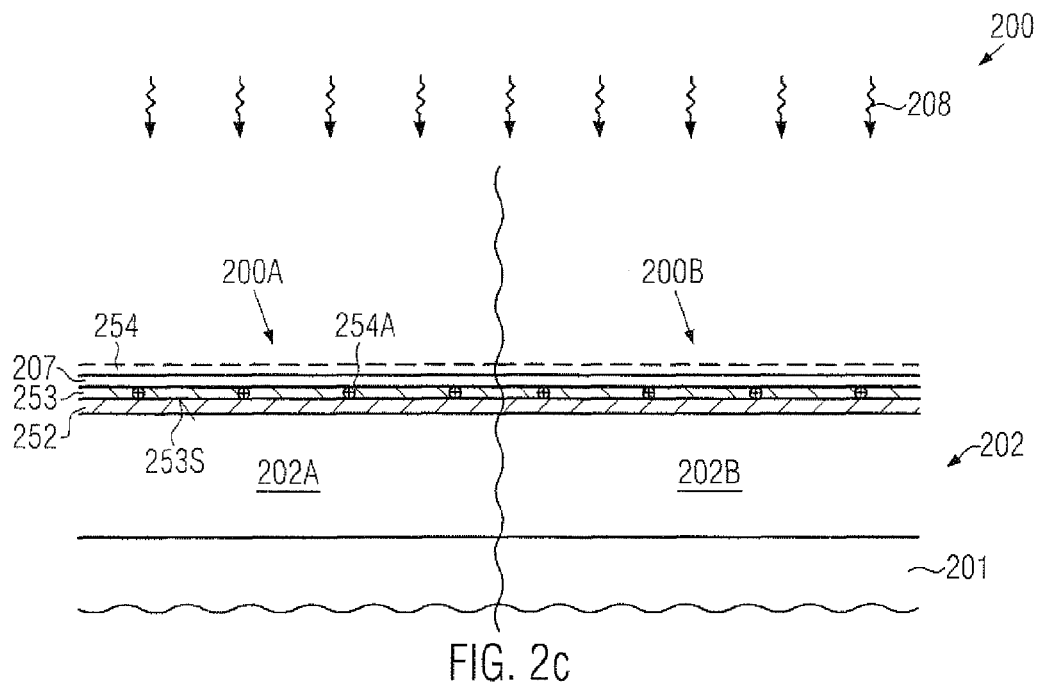

FIG. 2c schematically illustrates the semiconductor device 200 during a heat treatment 208 in which the layer 254 or any species contained therein may be diffused into the gate dielectric material, i.e., into the high-k dielectric material 253 and substantially to an interface 253S, depending on the diffusion blocking capability of the dielectric base layer 252. Consequently, during the treatment 208, which may be performed on the basis of appropriate temperatures in the range of approximately 700-1000° C. for instance, fixed charges 254A may be positioned within the materials 253, 252 and preferably at the interface 253S, wherein substantially the same conditions may prevail in the first and second semiconductor regions 200A, 200B. Consequently, a concentration and a location of the fixed charges 254A above the active regions 202A, 202B may be substantially the same, thereby providing very uniform conditions for adjusting the desired work function and hence the threshold voltage of transistor elements to be formed in and above the active regions 202A, 202B, respectively.

Figure 2D:
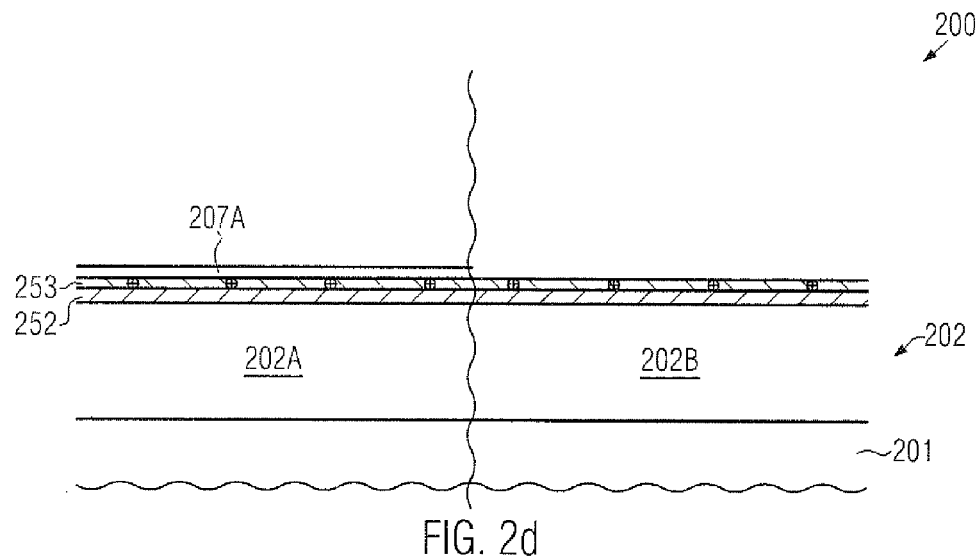

FIG. 2d schematically illustrates the device 200 in a further advanced manufacturing stage in which a portion of the material layer 207 (FIG. 2c) may be selectively removed from above the active region 202B, above which is to be formed a gate electrode structure having a gate dielectric material with increased thickness compared to the active region 202A. For this purpose, any appropriate etch recipe may be applied in combination with an appropriate etch mask, wherein the high-k dielectric material 253 may act as an etch stop material above the active region 202B. Consequently, a portion 207A may remain above the active region 202A, thereby further covering the high-k dielectric material 253.

Figure 2E:
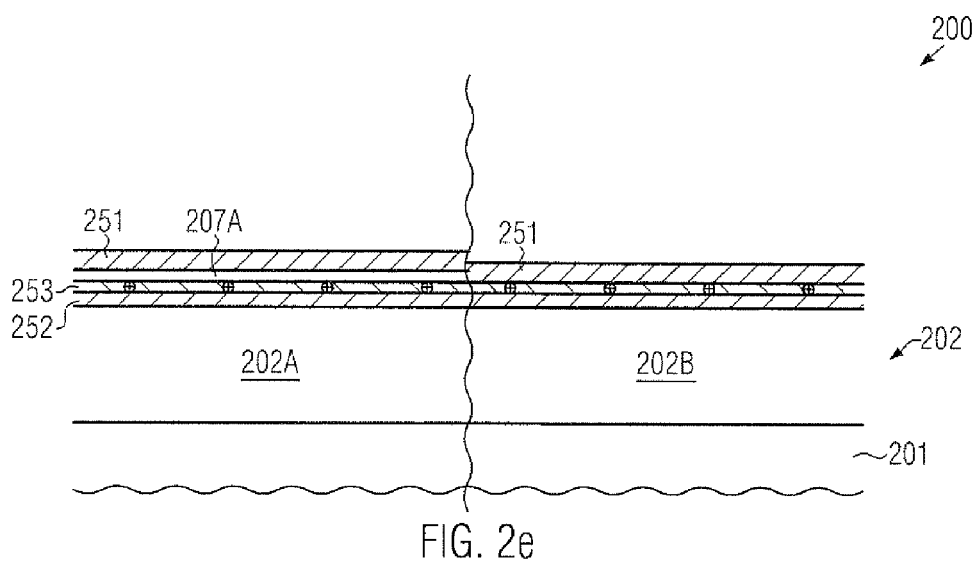

FIG. 2e schematically illustrates the device 200 with a further dielectric layer 251 formed above the active regions 202A, 202B. The dielectric layer 251 may be provided in the form of a silicon dioxide-based material, while, in other cases, any other appropriate dielectric materials may be used in order to obtain the desired transistor performance for a gate electrode structure requiring an increased thickness of a gate dielectric material. Hence, the thickness and material composition of the dielectric layer 251 may be selected such that, in combination with the layers 252 and 253, a desired gate dielectric material may be obtained above the active region 202B. For this purpose, well-established CVD techniques may be applied to form materials such as silicon dioxide with an appropriate thickness.

Figure 2F:
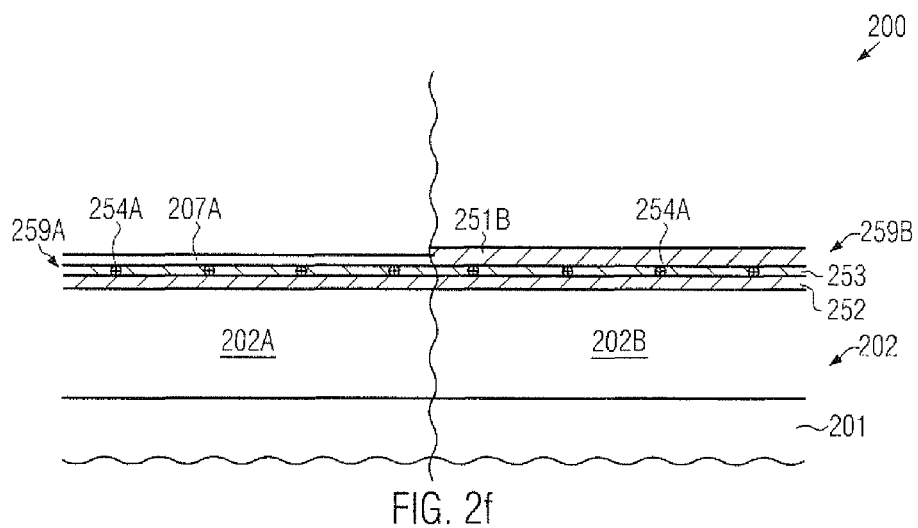

FIG. 2f schematically illustrates the device 200 in a further advanced manufacturing stage in which the dielectric layer 251 (FIG. 2e) is selectively removed from above the active region 202A. For this purpose, an appropriate etch mask, such as a resist mask, may be provided (not shown) and the device 200 may be exposed to an appropriate etch ambient, for instance a wet chemical etch ambient based on hydrofluoric acid (HF) when the material 251 is comprised of silicon dioxide. With other materials, any other appropriate etch chemistry may be applied. During the etch process, the remaining layer 207A may act as an efficient etch stop material, for instance in the form of titanium nitride, which exhibits a high etch selectivity with respect to HF, thereby reliably protecting the underlying high-k material 253. Consequently, a first gate dielectric material 259A may be formed on the active region 202A and may be comprised of the layers 252 and 253 including the work function adjusting species 254A, while a second thicker gate dielectric material 259B may be formed on the active region 202B and may be comprised of the materials 252 and 253 in combination with the dielectric layer 251B. On the other hand, the gate dielectric material 259B may also comprise the work function adjusting species 254A with the same concentration and spatial distribution, except for any process-related non-uniformities, as the gate dielectric material 259A, thereby providing a high degree of uniformity, for instance in terms of threshold voltage of transistors still to be formed.

Figure 2G:
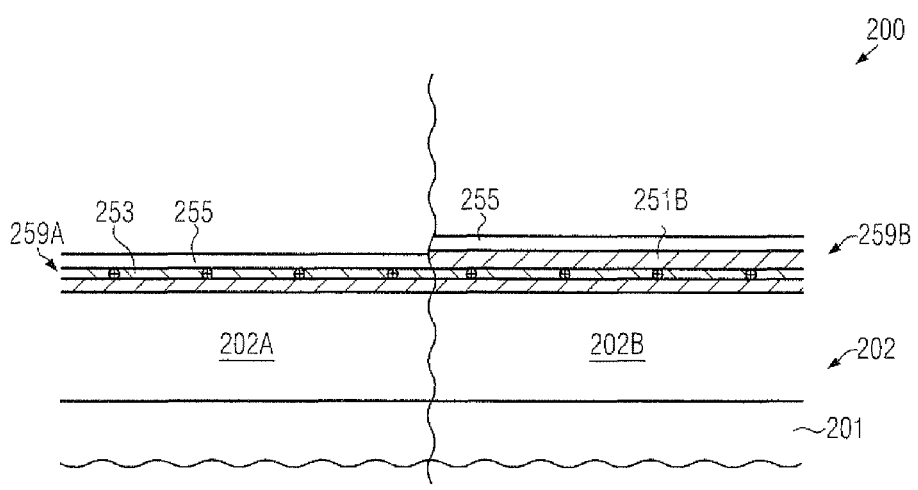

FIG. 2g schematically illustrates the device 200 in a manufacturing stage in which a metal-containing electrode material or cap material 255 may be formed on the gate dielectric materials 259A, 259B. In one illustrative embodiment, the material 255 may be provided in the form of a titanium nitride material, while, in other cases, any other appropriate material or materials may be provided, depending on the overall required configuration of the gate electrode structures still to be formed. For this purpose, the remaining layer 207A (FIG. 2f) may be removed by any appropriate etch recipe, which may have a pronounced etch selectivity with respect to the high-k dielectric material 253. For example, a plurality of high-k dielectric materials, such as hafnium oxide, may exhibit superior etch resistivity for a plurality of etch chemistries which may be used for removing materials selectively to silicon dioxide. Hence, any such etch recipe may be advantageously applied so as to efficiently remove the titanium nitride material while substantially not unduly affecting the high-k dielectric material 253 and also maintaining integrity of the dielectric layer 251B. If required, an etch mask may be provided to cover the gate dielectric material 259B.

Figure 2H:
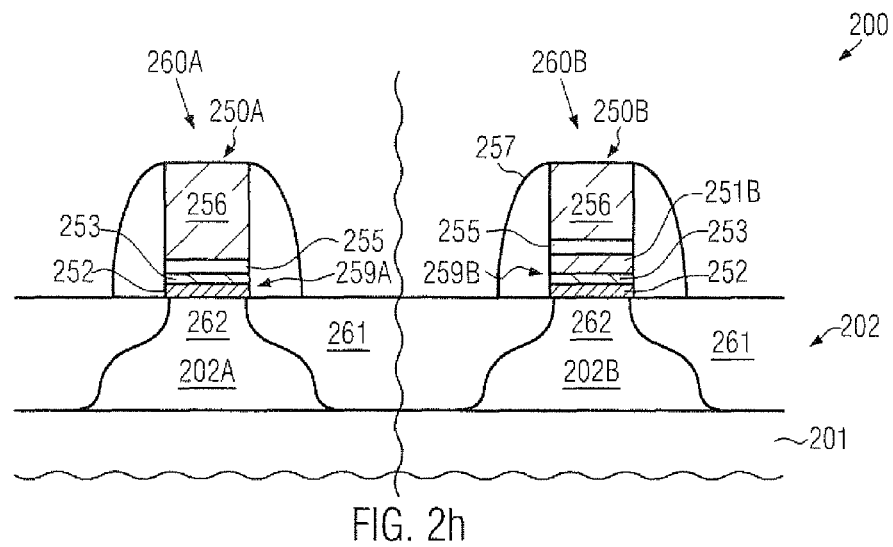

FIG. 2h schematically illustrates the device 200 in a further advanced manufacturing stage. As illustrated, a first transistor 260A is formed in and above the active region 202A and may comprise drain and source regions 261, which may laterally enclose a channel region 262. Similarly, a second transistor 260B may be formed in and above the active region 202B and may comprise the drain and source regions 261 in combination with the channel region 262, wherein, in some illustrative embodiments, the doping profile of the drain and source regions 261 and of the channel region 262 may be substantially the same for the transistors 260A, 260B. Furthermore, the transistor 260A may comprise a first gate electrode structure 250A including the gate dielectric material 259A, i.e., the layers 252 and 253, followed by the metal-containing electrode material 255, such as a titanium nitride material and the like, in combination with a further electrode material 256, such as a polysilicon material, a silicon/germanium mixture and the like. Similarly, the second transistor 260B may comprise a second gate electrode structure 250B comprising the gate dielectric material 259B having the increased thickness due to the presence of the dielectric layer 251B in combination with the material layers 252 and 253. Furthermore, the metal-containing material 255 may be provided in combination with the electrode material 256. Furthermore, a sidewall spacer structure 257 in accordance with process and device requirements may be formed on sidewalls of the electrode materials 256, 255 and the gate dielectric materials 259A, 259B.

With respect to any manufacturing techniques for forming the transistors 260A, 260B, any appropriate process strategy may be applied, for instance as previously explained with reference to the semiconductor device 100, wherein, in the embodiment shown, the channel regions 262 and the drain and source regions 261 may be formed on the basis of a common process sequence without requiring additional processes for adjusting the finally desired threshold voltage for the transistors 260A, 260B. That is, due to the high degree of uniformity of the spatial distribution of the work function adjusting species within the materials 252 and 253, as previously explained, a high degree of uniformity of the threshold voltage characteristics may be achieved, while at the same time the desired difference in thickness of the gate dielectric materials 259A, 259B may be provided.

With reference to FIGS. 2i-2m, further illustrative embodiments will now be described in which a highly conductive metal-containing electrode material may not be provided in the gate electrode structures having the gate dielectric material of increased thickness. In this case, the resulting "gate electrode structure" may also be used for any non-transistor elements in which the moderately high conductivity of the metal-containing electrode material may be considered inappropriate, for instance in polysilicon or other semiconductor-based resistive structures, which may have to be implemented in complex semiconductor devices.

Figure 2I:
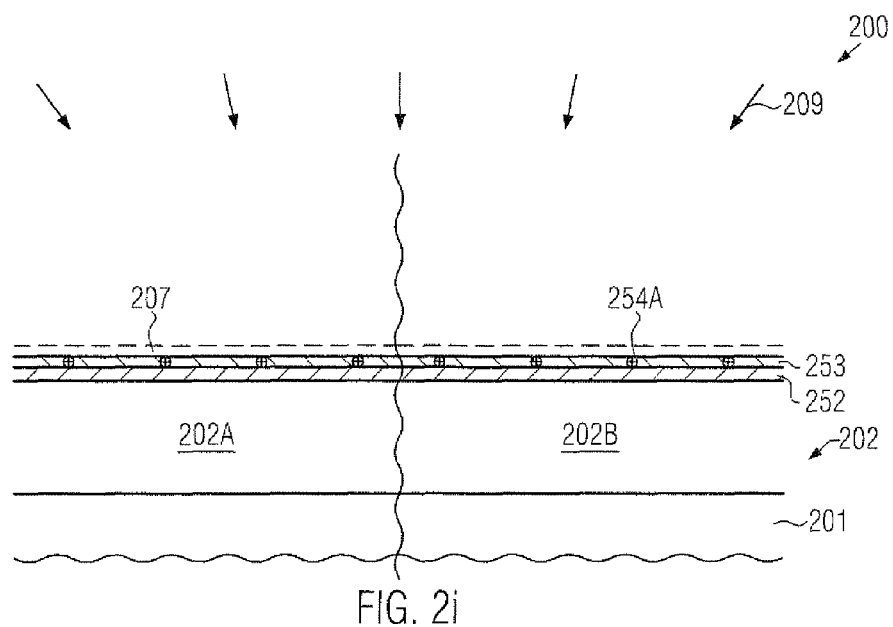
FIGS. 2i-2m schematically illustrate cross-sectional views of the semiconductor device in which gate electrode structures having a gate dielectric material of different thickness may be formed such that a metal-containing electrode material may be avoided in one type of gate electrode structure, thereby enabling use of these gate electrode structures as non-transistor elements, such as resistors, according to further illustrative embodiments.

FIG. 2i schematically illustrates the device 200 in a manufacturing stage in which the dielectric base layer 252 and the high-k dielectric material 253 have incorporated therein the work function adjusting species 254A, which may be accomplished on the basis of any appropriate anneal process. Moreover, it should be appreciated that any other species may be incorporated into the layers 252 and 253 so as to appropriately stabilize the resulting configuration, as is, for instance, explained with reference to the device 100. Moreover, the device 200 may be exposed to an etch ambient 209 so as to remove the material 207, possibly in combination with any residues of a material layer containing the work function adjusting species 254A, as is also previously discussed. The etch process 209 may be performed on the basis of any appropriate selective etch recipe in order to remove the layer 207, for instance provided in the form of titanium nitride, selectively with respect to the high-k dielectric material 253, which may exhibit a high etch resistivity with respect to a plurality of etch recipes. As previously discussed, the removal of the titanium nitride material 207 may be advantageous in view of the further processing, i.e., the patterning of the gate layer stack, as is also previously discussed.

Figure 2J:
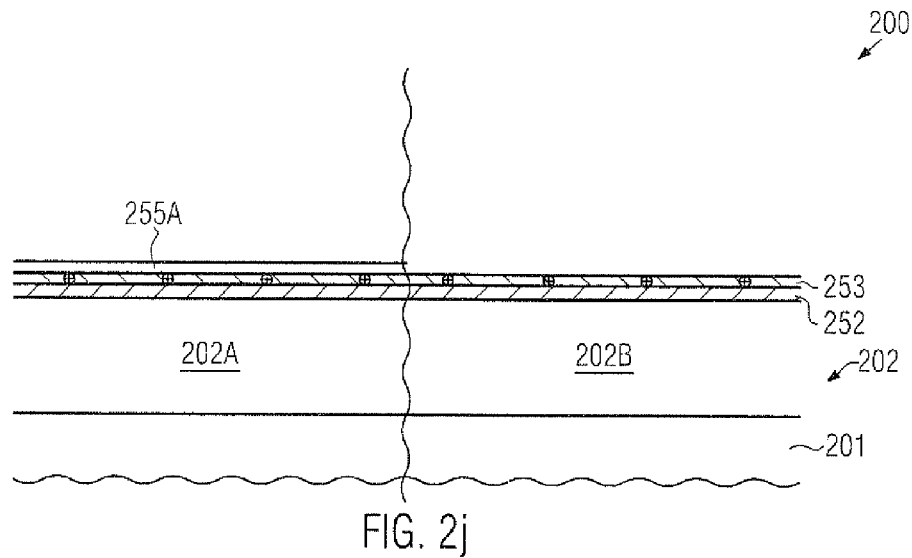

FIG. 2j schematically illustrates the device 200 in a further advanced manufacturing stage in which a metal-containing cap material or electrode material 255A may be selectively formed above the active region 202A. To this end, an appropriate material, such as titanium nitride, may be deposited and may be subsequently patterned on the basis of an etch mask, thereby removing the material from above the active region 202B while using the material 253 as an etch stop material.

Figure 2K:
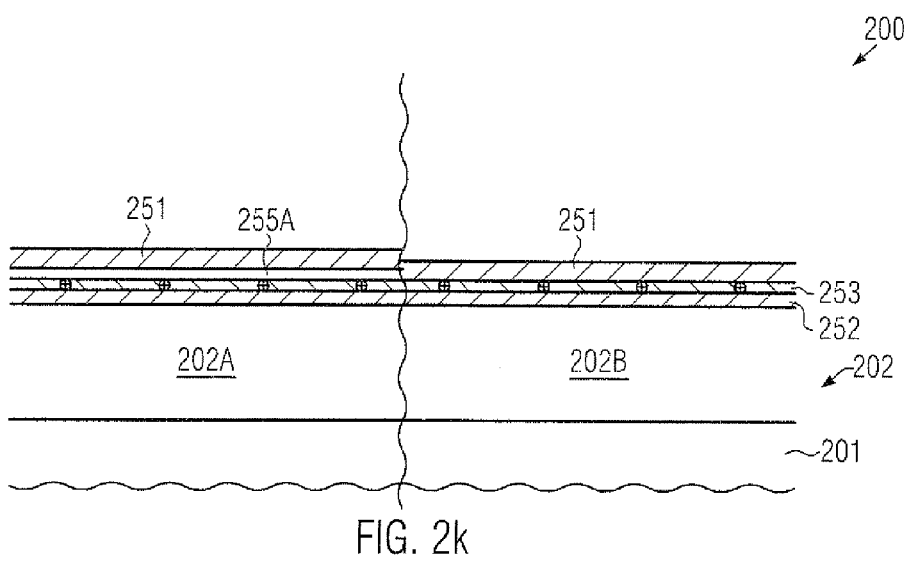

FIG. 2k schematically shows the device 200 with a dielectric layer 251 formed above the active regions 202A, 202B. With respect to material characteristics, such as composition and thickness of the layer 251, it may be referred to any explanations given above. Next, an etch mask (not shown) may be provided and an etch process may be performed, for instance on the basis of hydrofluoric acid, to remove the dielectric layer 251 selectively from above the active region 202A, while using the metal-containing material 255A as an efficient etch stop material, for instance in the form of titanium nitride, as explained above.

Figure 2L:
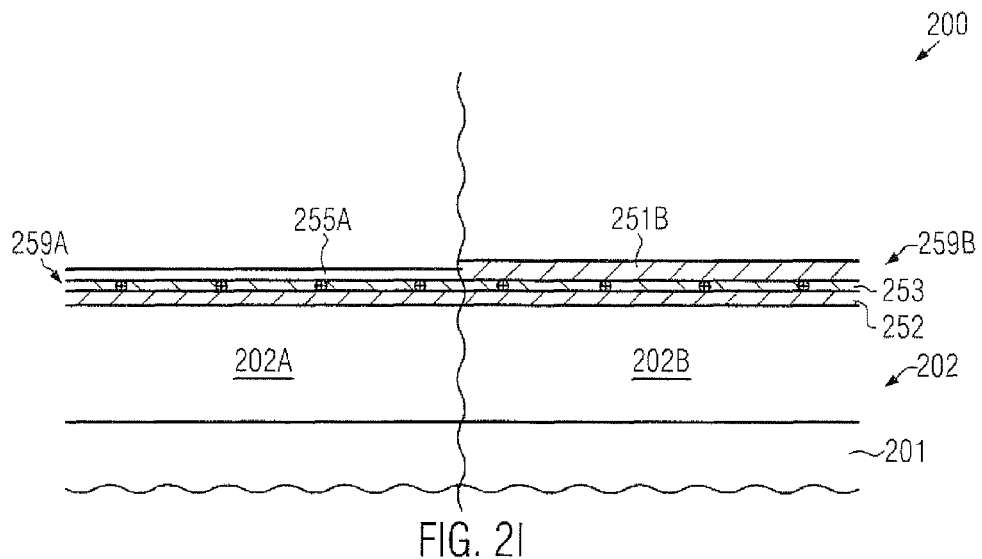

FIG. 2l schematically illustrates the semiconductor device 200 after the above-described process sequence. Consequently, the gate dielectric material 259A is formed above the active region 202A and is covered by the metal-containing material 255A, while the gate dielectric material 259B may be formed above the active region 202B and may comprise the dielectric layer 251B, which may additionally provide the integrity of the material 253 during the further processing. Consequently, a desired electrode material, such as silicon, silicon/germanium and the like, may be deposited, possibly in combination with other materials, such as cap materials, hard mask materials and the like, and the resulting layer stack may be patterned in accordance with well-established process techniques.

Figure 2M:
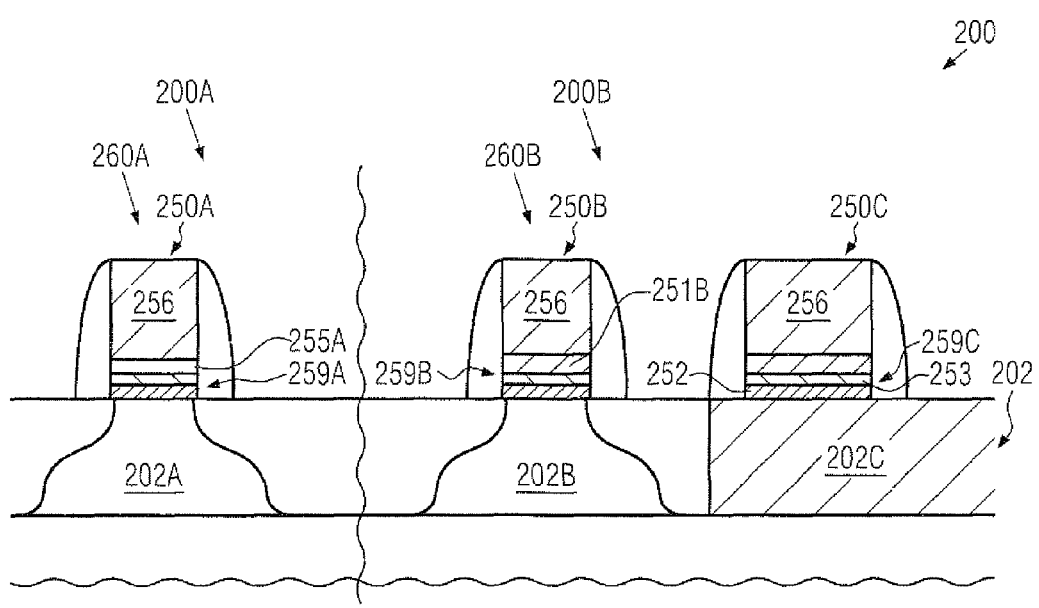

FIG. 2m schematically illustrates the semiconductor device 200 in a further advanced manufacturing stage. As illustrated, the transistor 260A may be formed in the first device region 200A and may comprise the gate electrode structure 250A comprising the gate dielectric material 259A in combination with the metal-containing electrode material 255A and the semiconductor-based electrode material 256. The second device region 200B may comprise the transistor 260B formed in and above the active region 202B, wherein the gate electrode structure 250B may comprise the gate dielectric material 259B including the dielectric layer 251B on which may be formed the semiconductor-based electrode material 256. Moreover, a further "gate electrode structure" 250C, which may represent any non-transistor circuit element, which, in one embodiment, may be represented by a resistor, may be formed in the second device region 200B, for instance on an isolation structure 202C. The isolation structure 202C may be formed in the semiconductor layer 202 on the basis of any well-established process techniques, for instance in the form of a shallow trench isolation, thereby also delineating corresponding active regions in the semiconductor layer 202. In the embodiment shown, the isolation structure 202C may be provided adjacent to the active region 202B, or at least a portion thereof. It should be appreciated, however, that the isolation structure 202C may be provided at any appropriate position within the device region 200B in accordance with the required circuit layout. The circuit element or gate electrode structure 250C may comprise a gate dielectric material 259C, which may have substantially the same configuration as the gate dielectric material 259B, when for instance the dielectric base layer 252 has been formed on the basis of a deposition technique. In other cases, for instance when formed by applying an oxidation process, the high-k dielectric material 253 may be directly formed on the insulating material of the isolation structure 202C. Since the gate dielectric materials 259B, 259C are formed on the basis of a common manufacturing process, any metal-containing electrode material formed thereon, such as the material 255A, may be avoided, thereby enabling an efficient adaptation of the overall resistivity of the structure 250C when used as a resistor. Consequently, superior transistor characteristics may be obtained for the transistor 260A on the basis of the gate dielectric material 259A, while the gate dielectric material 259B, 259C may be used in less critical transistors and any other non-transistor elements, wherein the high degree of uniformity of positioning the work function adjusting species may provide a desired threshold voltage uniformity of the transistors 260A, 260B.

As a result, the present disclosure provides semiconductor devices and manufacturing techniques in which a high degree of uniformity upon incorporating a work function adjusting species into a high-k dielectric material may be accomplished, which may thus result in superior uniformity of threshold voltages of transistors having gate electrode structures with different thickness gate dielectric materials.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:

forming a material layer stack above a first device region and a second device region, said material layer stack comprising a dielectric base layer, a high-k dielectric material formed on said dielectric base layer and metal-containing material formed on said high-k dielectric material;

performing a heat treatment so as to diffuse a metal species from said metal-containing material to an interface formed by said dielectric base layer and said high-k dielectric material;

forming a dielectric layer selectively above said second device region after performing said heat treatment; and forming a first gate electrode structure above said first device region and a second gate electrode structure above said second device region, said first gate electrode structure comprising said dielectric base layer and said high-k dielectric material as a first gate dielectric and said second gate electrode structure comprising said dielectric base layer, said high-k dielectric material and said dielectric layer as a second gate dielectric.

2. The method of claim 1, wherein forming said dielectric layer selectively above said second device region comprises removing said metal-containing material selectively above said second device region, depositing said dielectric layer above said first and second device region and removing said dielectric layer selectively from above said first device region by using said metal-containing material as an etch stop.

3. The method of claim 2, wherein said metal-containing material comprises titanium nitride.

4. The method of claim 3, wherein removing said dielectric layer selectively from above said second device region further comprises performing a wet chemical etch process on the basis of hydrofluoric acid.

5. The method of claim 1, further comprising removing said metal-containing material after forming said dielectric layer selectively above said second device region and forming a second metal-containing material above said first and second device regions.

6. The method of claim 1, wherein forming said material layer stack comprises forming a first metal-containing material on said high-k dielectric material and forming a work function adjusting species on said first metal-containing material.

7. The method of claim 1, wherein said dielectric base layer comprises silicon and oxygen.

8. The method of claim 1, wherein said dielectric layer comprises silicon dioxide.

9. The method of claim 1, further comprising forming a first transistor in said first device region on the basis of said first gate electrode structure and forming a second transistor in said second device region on the basis of said second gate electrode structure, wherein said first and second transistors have substantially the same threshold voltage.

10. The method of claim 1, further comprising removing said metal-containing material from above said first and second device regions and forming a second metal-containing material selectively above said first device region prior to forming said dielectric layer selectively above said second device region.

11. The method of claim 10, further comprising forming an electrode material on said second metal-containing material above said first device region and forming said electrode material on said dielectric layer above said second device region.

12. The method of claim 11, further comprising forming a transistor in said first device region on the basis of said first gate electrode structure and forming a resistor in said second device region on the basis of said second gate electrode structure.

13. A method, comprising:

forming a dielectric base layer on a first semiconductor region and a second semiconductor region of a semiconductor device;

forming a high-k dielectric material on said dielectric base layer above said first and second semiconductor regions, said dielectric base layer and said high-k dielectric material forming an interface;

forming a work function adjusting species at said interface above said first and second semiconductor regions;

forming a dielectric material on said high-k dielectric material selectively above said second semiconductor region; and forming a first gate electrode structure on said first semiconductor region and a second gate electrode structure on said second semiconductor region.

14. The method of claim 13, further comprising forming a metal-containing material layer on said high-k dielectric material and on said dielectric material.

15. The method of claim 14, further comprising forming a semiconductor electrode material on said metal-containing material.

16. The method of claim 13, further comprising forming a metal-containing material selectively on said high-k dielectric material and forming an electrode material on said metal-containing material and on said dielectric material.

17. The method of claim 13, wherein forming said work function adjusting species at said interface comprises forming a material layer comprising said work function adjusting species on said high-k dielectric layer and annealing said semiconductor device.

18. The method of claim 17, further comprising removing said material layer and forming a metal-containing material selectively on said high-k dielectric material above said first semiconductor region.

19. The method of claim 18, wherein said material layer and said metal-containing material comprises titanium nitride.

* * * * *